(12) United States Patent
Iizuka

(10) Patent No.: US 10,109,458 B2
(45) Date of Patent: Oct. 23, 2018

(54) MULTI CHARGED-PARTICLE BEAM WRITING APPARATUS AND ADJUSTMENT METHOD FOR THE SAME

(71) Applicant: NuFlare Technology, Inc., Yokohama-shi (JP)

(72) Inventor: Osamu Iizuka, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/616,462

(22) Filed: Jun. 7, 2017

(65) Prior Publication Data

US 2017/0358425 A1 Dec. 14, 2017

(30) Foreign Application Priority Data

Jun. 9, 2016 (JP) ................................ 2016-115479

(51) Int. Cl.
*G01N 23/00* (2006.01)
*H01J 37/30* (2006.01)
(Continued)

(52) U.S. Cl.
CPC ........ *H01J 37/3005* (2013.01); *H01J 37/045* (2013.01); *H01J 37/1474* (2013.01);
(Continued)

(58) Field of Classification Search
CPC .. H01J 37/00; H01J 37/02; H01J 37/30; H01J 37/3002; H01J 37/3005; H01J 37/3007; H01J 37/304; H01J 37/3056
(Continued)

(56) References Cited

U.S. PATENT DOCUMENTS

| | | | |
|---|---|---|---|
| 2003/0189181 A1* | 10/2003 | Ohta | B82Y 10/00 250/492.22 |
| 2004/0188636 A1* | 9/2004 | Hosoda | B82Y 10/00 250/492.22 |
| 2013/0264499 A1* | 10/2013 | Nishimura | H01J 37/30 250/492.22 |

FOREIGN PATENT DOCUMENTS

| | | |
|---|---|---|
| JP | 10-106931 | 4/1998 |
| JP | 4563756 | 10/2010 |
| JP | 4756776 | 8/2011 |

OTHER PUBLICATIONS

Office Action dated Jun. 18, 2018 in Korean Application No. 10-2017-0071390, along with an English translation.

* cited by examiner

*Primary Examiner* — Jason McCormack
(74) *Attorney, Agent, or Firm* — Oblon, McClelland, Maier & Neustadt, L.L.P.

(57) ABSTRACT

In one embodiment, a multi charged-particle beam writing apparatus includes a plurality of blankers switching between ON and OFF state of a corresponding beam among multiple beams, a main deflector deflecting beams having been subjected to blanking deflection to a writing position of the beams in accordance with movement of a stage, a detector scanning a mark on the stage with each of the beams having been deflected by the main deflector and detecting a beam position from a change in intensity of reflected charged particles and a position of the stage, and a beam shape calculator switching an ON beam, scanning the mark with the ON beam, and calculating a shape of the multiple beams from a beam position. A shape of a deflection field of the main deflector is corrected by using a polynomial representing an amount of beam position shift that is dependent on a beam deflection position of the main deflector and then the (Continued)

mark is scanned with the ON beam. The polynomial is different for each ON beam.

10 Claims, 8 Drawing Sheets

(51) Int. Cl.
    *H01J 37/04*         (2006.01)
    *H01J 37/147*       (2006.01)
    *H01J 37/244*       (2006.01)
    *H01J 37/317*       (2006.01)

(52) U.S. Cl.
    CPC ........ *H01J 37/244* (2013.01); *H01J 37/3177* (2013.01); *H01J 2237/0435* (2013.01); *H01J 2237/24542* (2013.01); *H01J 2237/31776* (2013.01)

(58) Field of Classification Search
    USPC ..... 250/492.1, 306, 307, 311, 492.2, 492.22, 250/492.3
    See application file for complete search history.

R2

R3

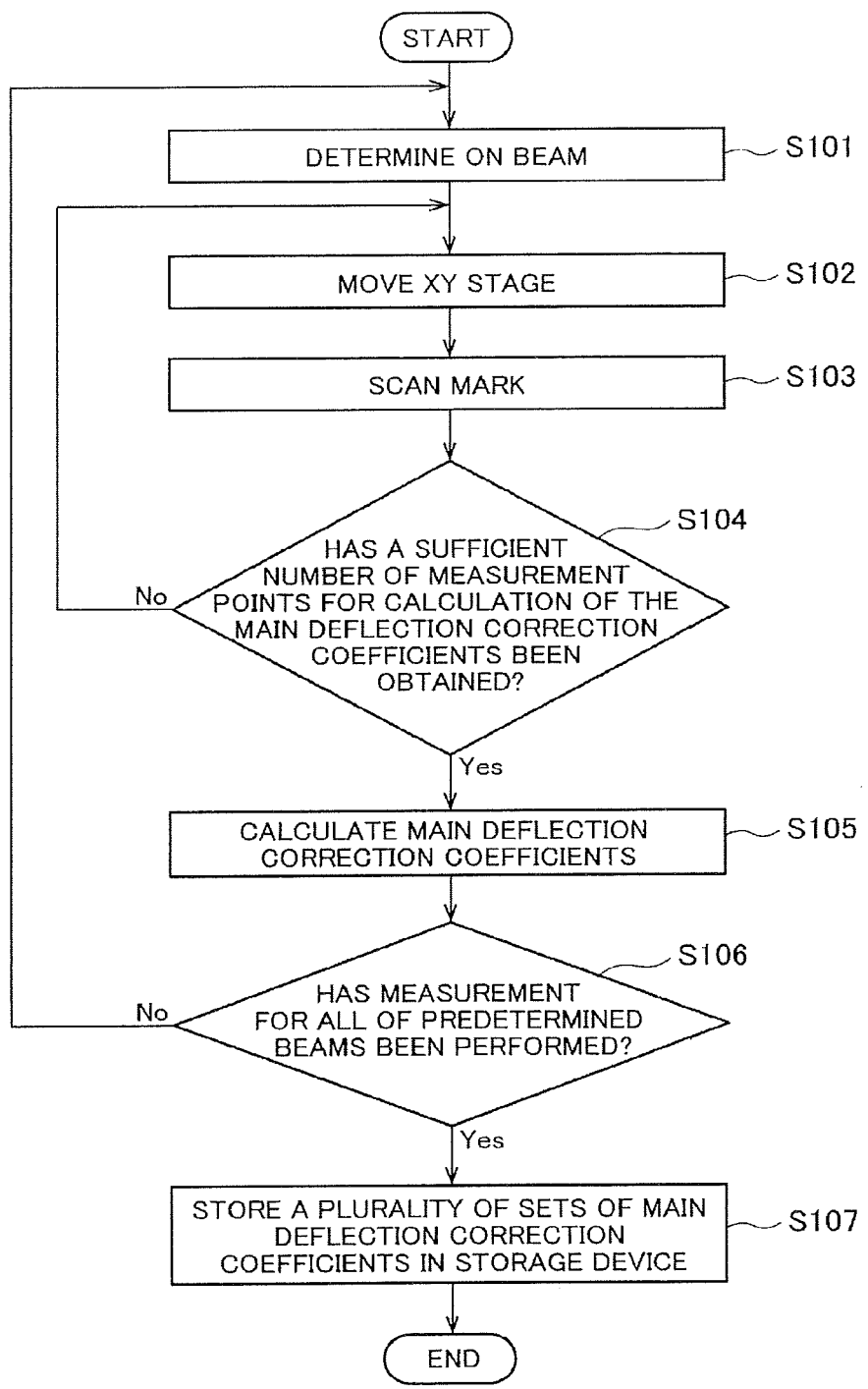

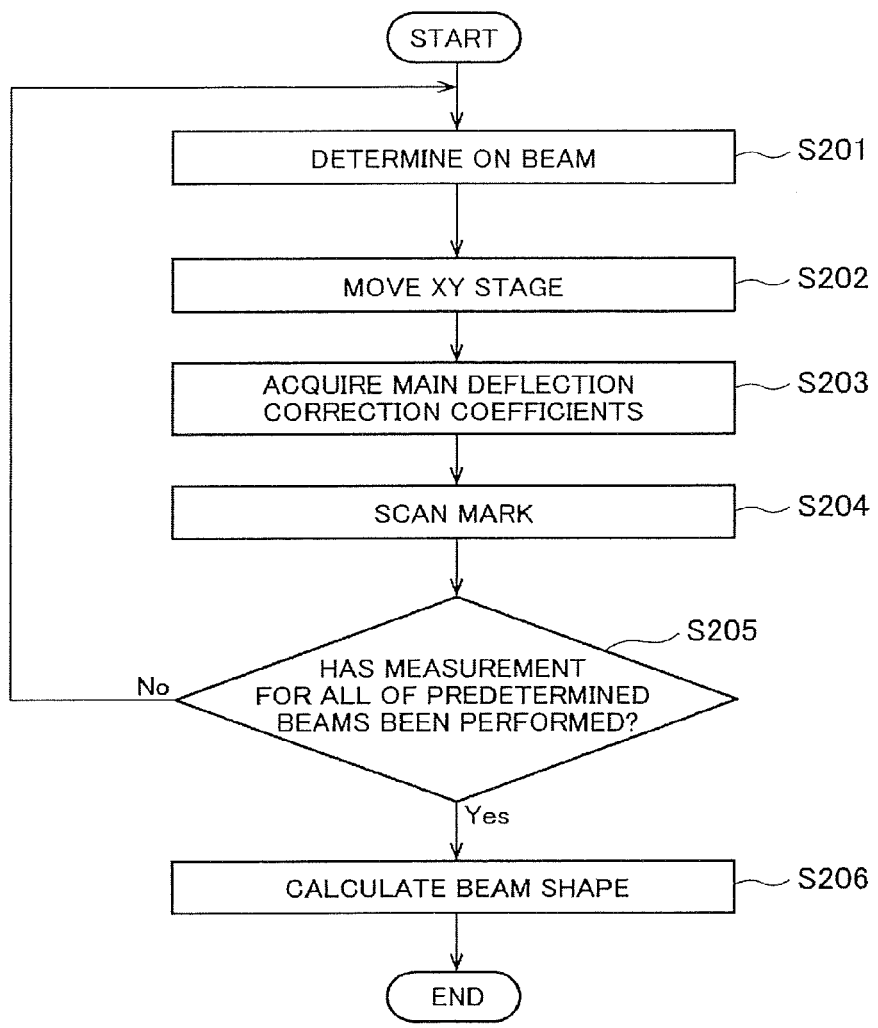

MULTI CHARGED-PARTICLE BEAM WRITING APPARATUS AND ADJUSTMENT METHOD FOR THE SAME

CROSS REFERENCE TO RELATED APPLICATION

This application is based upon and claims benefit of priority from the Japanese Patent Application No. 2016-115479, filed on Jun. 9, 2016, the entire contents of which are incorporated herein by reference.

FIELD

The present invention relates to a multi charged-particle beam writing apparatus and an adjustment method for the same.

BACKGROUND

Along with an improvement in integration of LSIs, circuit line widths of semiconductor devices have become finer. As an example of a method for forming exposure masks (exposure masks used in steppers and scanners are also called reticles) that are used for forming circuit patterns in such semiconductor devices, an electron-beam writing technology having high resolution has been used.

For example, there are writing apparatuses that use multiple beams. The use of multiple beams can greatly improve the throughput because it enables irradiation with more beams at a time (in a single shot) than in the case where writing is performed using a single electron beam. In such multi-beam writing apparatuses, for example, multiple beams are formed by letting an electron beam emitted from an electron gun pass through an aperture member having a plurality of apertures. Blanking control is performed on each of the beams. Unblocked beams are each reduced by an optical system, and a substrate placed on a movable stage is irradiated with the resulting beams.

Multi-beam writing apparatuses include a main deflector and a sub deflector that deflect beams to determine the beam irradiation position on a substrate. The main deflector collectively aligns the multiple beams to a predetermined position on a substrate, and the sub deflector deflects the beams so that beam pitches are filled.

Such multi-beam writing apparatuses write a pattern of a desired figure shape by emitting a plurality of beams at a time and linking the beams that are formed as a result of the beams passing through the same or different apertures of an aperture member. Since the shape of the entire multi-beam image with which the substrate is irradiated appears as the stitching accuracy of the written figures, it is essential to adjust a reduction ratio (magnification ratio) and a distortion of the entire multi-beam image.

Since the reduction ratio or the like of the entire multi-beam image is adjusted based on the beam shape, the beam shape needs to be accurately measured. The beam shape is measured by scanning a reflection mark on the stage while sequentially switching between beams to be ON and by detecting the position of the beam.

However, there is an issue in that when the reflection mark on the stage is scanned, an amount of beam deflection applied by the main deflector increases, which changes the path of the beam and distorts the beam shape and consequently decreases the accuracy of beam shape measurement.

BRIEF DESCRIPTION OF THE DRAWINGS

FIG. 9 is a flowchart for describing a main-deflection-correction-coefficient calculation method according to the embodiment.

FIG. 10 is a flowchart for describing a beam shape measurement method according to the embodiment.

DETAILED DESCRIPTION

In one embodiment, a multi charged-particle beam writing apparatus includes a stage on which a substrate is placed and that is continuously movable, an emitter emitting a charged-particle beam, an aperture member that has a plurality of openings and that is irradiated with the charged-particle beam in a region including all of the plurality of openings and forms multiple beams by letting part of the charged-particle beam pass through the plurality of openings, a blanking plate on which a plurality of blankers are disposed, each of the plurality of blankers being configured to perform blanking deflection for switching between ON and OFF of a corresponding beam among the multiple beams having passed through the plurality of openings of the aperture member, a main deflector deflecting beams having been subjected to blanking deflection to a writing position of the beams in accordance with movement of the stage, a detector scanning a mark on the stage with each of the beams having been deflected by the main deflector and detecting a beam position from a change in intensity of reflected charged particles and a position of the stage, and a beam shape calculator switching an ON beam by using the blankers, scanning the mark with the ON beam, and calculating a shape of the multiple beams on the stage from a beam position of each ON beam. The shape of a deflection field of the main deflector is corrected by using a polynomial representing an amount of beam position shift that is dependent on a beam deflection position of the main deflector and then the mark is scanned with the ON beam. The polynomial is different for each ON beam.

In an embodiment, a configuration that uses an electron beam as an example of a charged-particle beam will be described below. Note that a charged-particle beam is not limited to an electron beam and may be another charged-particle beam, such as an ion beam.

Figure 1:
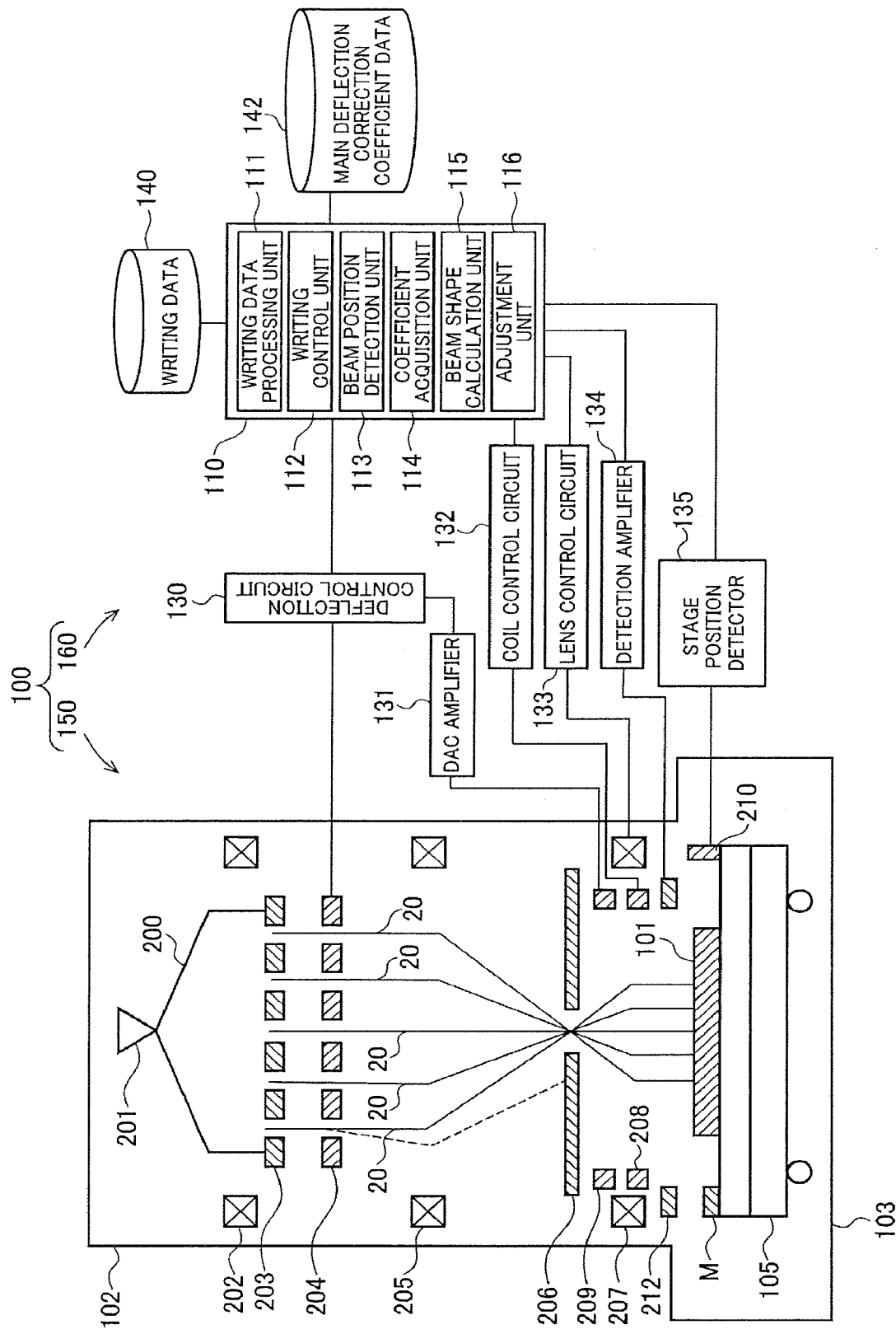
FIG. 1 is a schematic configuration diagram of a writing apparatus according to an embodiment of the present invention.

FIG. 1 is a schematic diagram illustrating the configuration of a writing apparatus according to the present embodiment. In FIG. 1, a writing apparatus 100 includes a writing unit 150 and a control unit 160. The writing apparatus 100 is an example of a multi charged-particle beam writing apparatus. The writing unit 150 includes a column 102 and a writing chamber 103. In the column 102, an electron gun 201, an illumination lens 202, an aperture member 203, a blanking plate 204, a reduction lens 205, a restricting aperture member 206, an objective lens 207, a coil 208, a main deflector 209, and a sub deflector (not illustrated) are disposed.

In the writing chamber 103, a detector 212 and an XY stage 105 are disposed. A substrate 101 subjected to writing is placed on the XY stage 105. Examples of the substrate 101 include an exposure mask used to fabricate a semiconductor device or a semiconductor substrate (silicon wafer) on which a semiconductor device is to be fabricated. Examples of the substrate 101 also include mask blanks on which a resist has been applied but nothing has been written yet.

A mirror 210 for use in position measurement of the XY stage 105 is disposed on the XY stage 105. In addition, a mark M for use in beam calibration is provided on the XY stage 105. The mark M has, for example, a cross shape so that the position is easily detected through scanning with an electron beam (see FIG. 3). The detector 212 detects electrons reflected from the mark M when the cross of the mark M is scanned with an electron beam.

The control unit 160 includes a control computer 110, a deflection control circuit 130, a digital-to-analog conversion (DAC) amplifier 131, a coil control circuit 132, a lens control circuit 133, a detection amplifier 134, a stage position detector 135, and storage devices 140 and 142, such as magnetic disk devices.

The deflection control circuit 130, the coil control circuit 132, the lens control circuit 133, the detection amplifier 134, the stage position detector 135, and the storage devices 140 and 142 are connected to the control computer 110 via a bus. The storage device 140 receives writing data from outside and stores the writing data. The storage device 142 stores main deflection correction coefficient data described later.

The DAC amplifier 131 is connected to the deflection control circuit 130. The DAC amplifier 131 is connected to the main deflector 209. The coil 208 is connected to the coil control circuit 132. The objective lens 207 is connected to the lens control circuit 133.

The control computer 110 includes a writing data processing unit 111, a writing control unit 112, a beam position detection unit 113, a coefficient acquisition unit 114, a beam shape calculation unit 115, and an adjustment unit 116. Functions of the respective units of the control computer 110 may be implemented by hardware including processing circuitry, or by software. When the functions are implemented by software, a program that implements at least some functions of the control computer 110 may be stored on a recording medium and may be loaded and executed by a computer including an electric circuit (processing circuitry). The recording medium is not limited to a removable medium, such as a magnetic disk or an optical disc, and may be a fixed recording medium, such as a hard disk drive or a memory.

Figure 2:
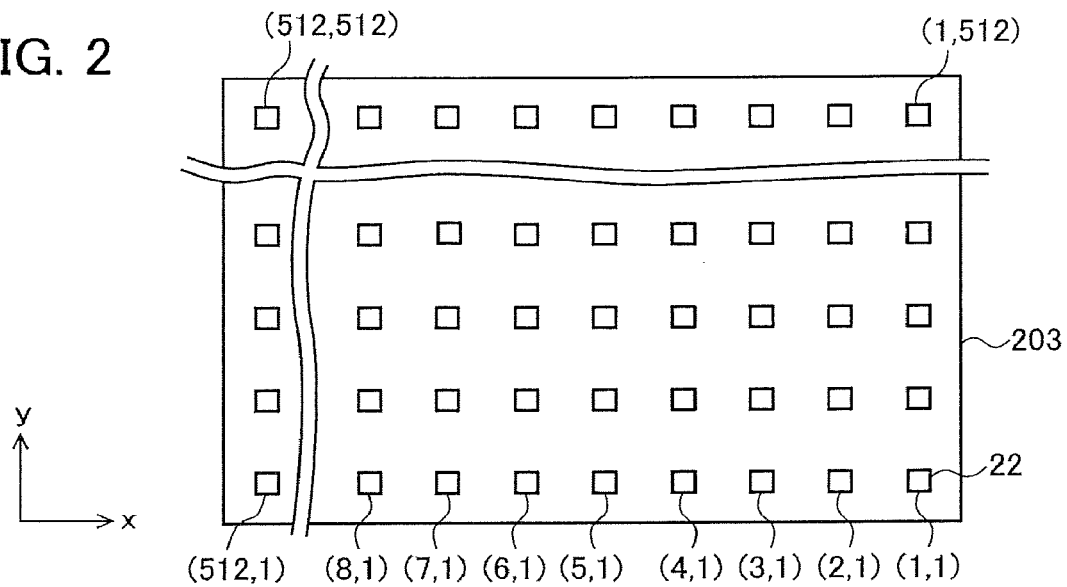
FIG. 2 is a schematic diagram illustrating the configuration of an aperture member.

FIG. 2 is a schematic diagram illustrating the configuration of the aperture member 203. As illustrated in FIG. 2, the aperture member 203 has apertures (openings) 22 that are arranged in a matrix of m rows in the vertical direction (y direction) and n columns in the horizontal direction (x direction) (where m, n≥2) at a predetermined arrangement pitch. In FIG. 2, the apertures 22 arranged in 512 columns and 512 rows in the horizontal and vertical directions (x and y directions) are formed. The apertures 22 are formed to have the same quadrangular shape of the same dimensions. Alternatively, the apertures 22 may have a circular shape of the same diameter.

An electron beam 200 passes through the plurality of apertures 22 of the aperture member 203. In this way, a plurality of electron beams (multiple beams) 20 having a quadrangular shape, for example, are formed.

Arrangement of the apertures 22 is not limited to the case where the apertures 22 are vertically and horizontally arranged in a grid as illustrated in FIG. 2. For example, the apertures in the k-th row and the apertures in the k+1-th row in the vertical direction (y direction) may be arranged to be shifted from each other in the horizontal direction (x direction).

The blanking plate 204 has passage apertures (openings) at respective positions each corresponding to a corresponding one of the apertures 22 of the aperture member 203 illustrated in FIG. 2, and the passage apertures let the respective multiple beams pass therethrough. In the vicinity of each of the passage apertures, electrodes (blanker: blanking deflector) for use in blanking deflection for deflecting a corresponding beam are disposed.

The electron beams 20 that pass through the respective passage apertures are deflected independently of one another by voltages applied from the respective blankers. Through this deflection, blanking control is performed. As described above, a plurality of blankers each perform blanking deflection on a corresponding one of the multiple beams that have passed through the plurality of apertures 22 (openings) of the aperture member 203.

An operation of the writing unit 150 will be described next. The electron beam 200 emitted from the electron gun 201 (emitting unit) illuminates the entire aperture member 203 substantially vertically via the illumination lens 202. The electron beam 200 passes through the plurality of apertures 22 of the aperture member 203, whereby the multiple beams 20 are formed. Each of the multiple beams 20 passes through a corresponding one of the passage apertures of the blanking plate 204.

The multiple beams 20 that have passed through the blanking plate 204 are reduced by the reduction lens 205 and travel toward the aperture formed at the center of the restricting aperture member 206. Each electron beam 20 that has been deflected by the blanker of the blanking plate 204 to be OFF deviates from the aperture at the center of the restricting aperture member 206 (blanking aperture member) and is blocked by the restricting aperture member 206. In contrast, each electron beam 20 that has been deflected by the blanker of the blanking plate 204 to be ON passes through the aperture at the center of the restricting aperture member 206.

As described above, the restricting aperture member 206 blocks beams that have been deflected by the blankers so as to be in an OFF state. Beams that are formed and pass through the restricting aperture member 206 after the beams are set to ON before the beams are set to OFF constitute beams for a single shot.

The multiple beams 20 that have passed through the restricting aperture member 206 are subjected to alignment adjustment by the coil 208, are set in focus by the objective lens 207, and form a pattern image at a desired reduction ratio. The main deflector 209 collectively deflects beams (all the multiple beams) that have passed through the restricting aperture member 206 in the same direction, so that the writing position (irradiation position) on the substrate 101 is irradiated with the beams.

When the XY stage 105 is continuously moving, tracking control is performed by the main deflector 209 so that the writing position (irradiation position) of the beams moves in accordance with movement of the XY stage 105. The position of the XY stage 105 is measured by using reflected light obtained by irradiating the mirror 210 on the XY stage 105 with a laser from the stage position detector 135.

The multiple beams for a single irradiation are ideally arranged at a pitch obtained by multiplying the arrangement pitch of the plurality of apertures 22 of the aperture member 203 by the aforementioned desired reduction ratio. The sub deflector (not illustrated) deflects all the multiple beams so that the beam pitches are filled.

The writing data processing unit 111 of the control computer 110 reads writing data from the storage device 140, performs a plurality of steps of data conversion, and generates shot data. Shot data defines whether to irradiate each irradiation region, which is obtained by dividing a writing surface of the substrate 101 into a plurality of grid-shaped irradiation regions in accordance with the beam size, for example, and defines an irradiation period.

The writing control unit 112 outputs a control signal to the deflection control circuit 130 on the basis of the shot data and stage position information. The deflection control circuit 130 controls voltage to be applied to each blanker of the blanking plate 204 on the basis of the control signal. The deflection control circuit 130 also computes amount-of-deflection data (tracking deflection data) used to perform beam deflection in accordance with movement of the XY stage 105. The tracking deflection data, which is a digital signal, is output the DAC amplifier 131. The DAC amplifier 131 converts the digital signal into an analog signal, amplifies the resulting analog signal, and applies the amplified analog signal to the main deflector 209 as tracking deflection voltage.

The multi-beam writing apparatus writes a pattern of a desired figure shape by irradiating the substrate 101, which is subjected to writing, with many beams arranged at a pitch obtained by multiplying the arrangement pitch of the plurality of apertures 22 of the aperture member 203 by a predetermined reduction ratio at a time and by linking the beams to fill the beam pitches. Accordingly, it is necessary to detect beam positions and calibrate main deflection sensitivity of the main deflector 209 and to measure the beam shape and adjust the dimensions.

Figure 3:
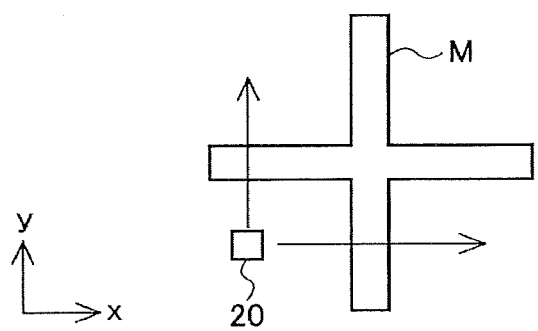
FIG. 3 is a diagram for describing a beam position measurement method.

When the beam position is detected, the cross of the mark M is scanned by deflecting each electron beam 20 in the left-and-right and back-and-forth directions (x and y directions) using the main deflector 209 as illustrated in FIG. 3. Reflected electrons are detected by the detector 212. A resulting signal is amplified by the detection amplifier 134 and is converted into digital data. The obtained measurement data is output to the control computer 110.

The beam position detection unit 113 is capable of calculating the position of the beam from a profile obtained by arranging the measured reflected electrons in time series and the position of the stage at that time.

Figure 4:
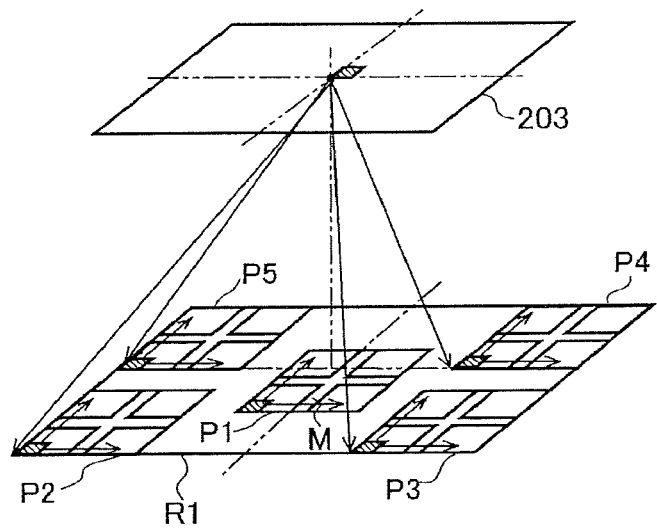
FIG. 4 is a diagram for describing a main-deflection-sensitivity measurement method.

When the main deflection sensitivity is measured, only a specific beam is set to ON and the beam position is measured while changing an amount of deflection applied by the main deflector 209. For example, as illustrated in FIG. 4, only a beam that passes through the aperture 22 at the center of the aperture member 203 is set to ON. The mark M is moved to a position P1, which is right under the ON beam. The cross of the mark M is scanned, and the beam position is calculated.

Then, the mark M is moved to another position P2 in a main deflection field (deflection field of the main deflector 209) R1, and the beam position is calculated in the similar way. Then, the mark M is further moved sequentially to other positions P3, P4, and P5, and the beam position is calculated at the respective positions. The main deflection sensitivity can be calibrated by comparing the amounts of deflection applied by the main deflector 209 with the calculated beam positions.

Figure 5:
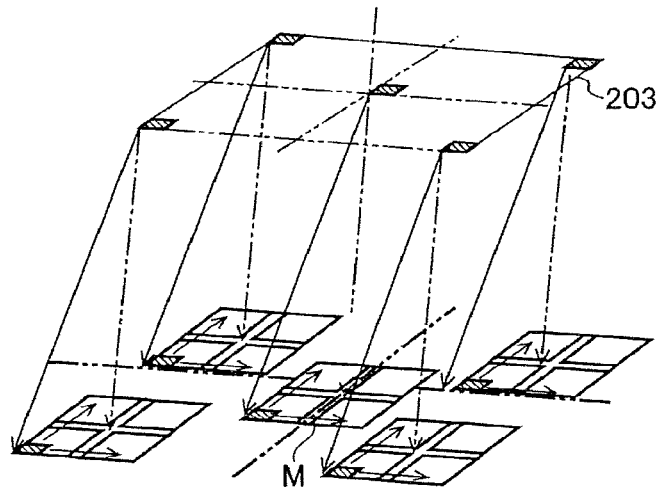
FIG. 5 is a diagram for describing a beam shape measurement method.

When the beam shape is measured, the beam set to ON is sequentially switched between beams corresponding to the center and four corners of the aperture member 203, and measurement similar to the main deflection sensitivity measurement is performed as illustrated in FIG. 5. The mark M can be moved to a position right under the ON beam on the basis of the designed value of the beam size.

Figure 6A:
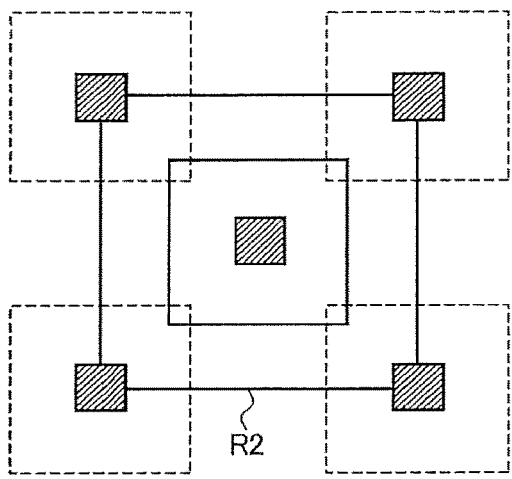
FIGS. 6A and 6B are diagrams each illustrating a main deflection field in the case where the beam shape is not distorted.
Figure 6B:
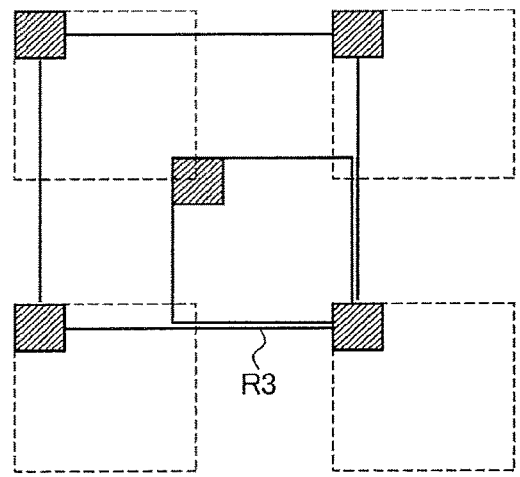

FIGS. 6A and 6B respectively illustrate main deflection fields R2 and R3 in the case where the beam shape is not distorted. FIG. 6A illustrates the case where only a beam that passes through the aperture 22 at the center of the aperture member 203 is set to ON, whereas FIG. 6B illustrates the case where only a beam that passes through one of the apertures 22 at the four corners of the aperture member 203 is set to ON. The main deflection fields R2 and R3 have the same square shape.

With writing devices practically used, the beam shape is slightly distorted. In addition, since a large amount of deflection is applied by the main deflector 209 when the beam shape is measured, the beam shape is additionally distorted due to shifting of the beam position that is dependent on the deflection position of the main deflector 209.

Figure 7A:
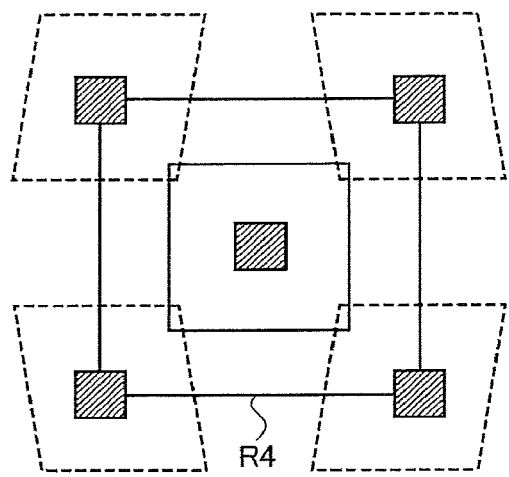
FIGS. 7A to 7C are diagrams each illustrating a main deflection field in the case where the beam shape is distorted.
Figure 7B:
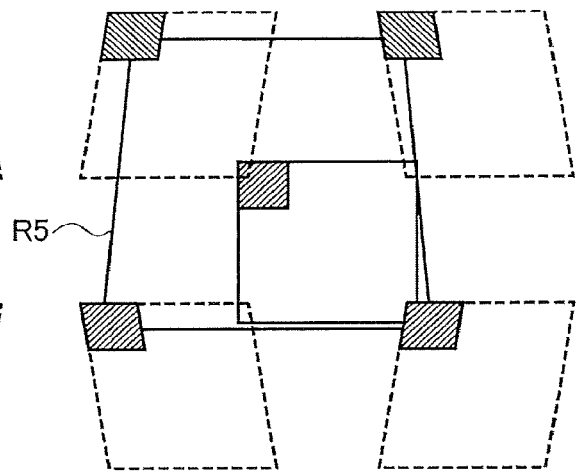
Figure 7C:
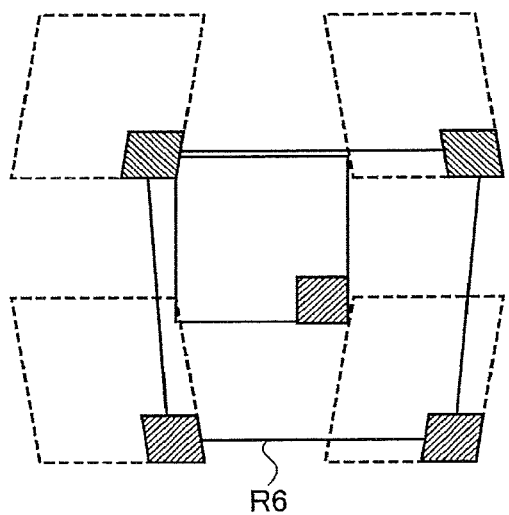

FIGS. 7A to 7C respectively illustrate main deflection fields R4 to R6 in the case where the beam shape is distorted. FIG. 7A illustrates the case where only a beam that passes through the aperture 22 at the center of the aperture member 203 is set to ON, whereas FIGS. 7B and 7C each illustrate the case where only a beam that passes through one of the apertures 22 at the four corners of the aperture member 203 is set to ON. The main deflection field R4 has a square shape, whereas the main deflection fields R5 and R6 are distorted and have a trapezoidal shape.

Figure 8:
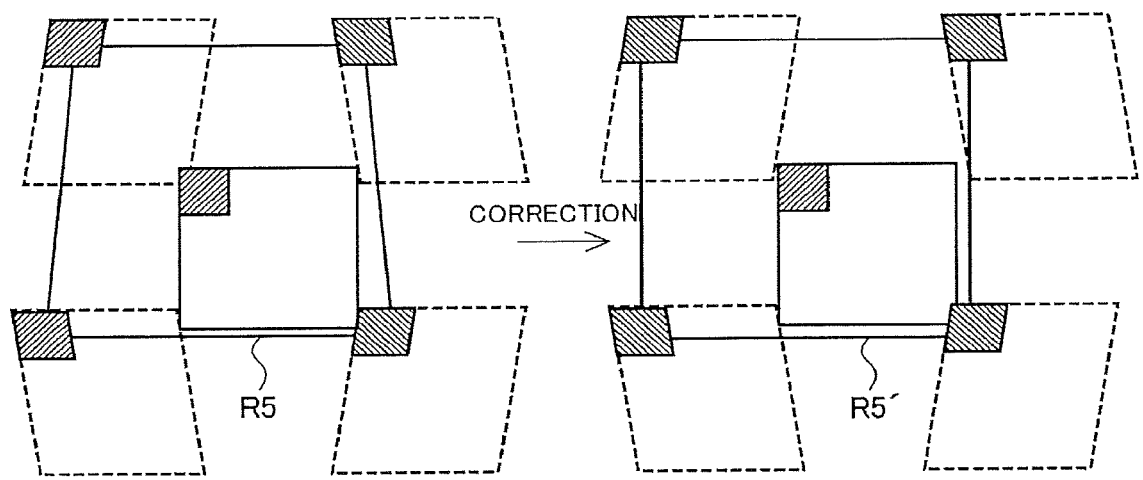
FIG. 8 is a diagram illustrating a correction example the shape of the main deflection field.

If the main deflection fields R4 to R6 have different shapes because the beams have passed through different apertures 22 of the aperture member 203 in this way, the accuracy of beam shape measurement decreases. Accordingly, the shape of the main deflection field is corrected in the present embodiment so that main deflection fields of beams that have passed through different apertures 22 of the aperture member 203 have the same shape as illustrated in FIG. 8. For example, a corrected main deflection field R5' illustrated in FIG. 8 has a square shape, which is the same as the shape of the main deflection field R4 illustrated in FIG. 7A.

Amounts Δx and Δy of beam position shift (main deflection distortion) that is dependent on the deflection position (x, y) of the main deflector 209 can be expressed for each of the apertures 22 of the aperture member 203 by using following high-order polynomials. The amounts of beam position shift are expressed by using fourth-order polynomials in the present embodiment. Alternatively, they may be expressed by using third-order polynomials or by using fifth-order or higher-order polynomials.

$$\Delta x = a_0 + (a_1+1)x + a_2 y + a_3 x^2 + a_4 xy + a_5 y^2 + a_6 x^3 + a_7 x^2 y + a_8 xy^2 + a_9 y^3 + \ldots + a_{14} y^4$$

$$\Delta y = b_0 + b_1 x + (b_2+1)y + b_3 x^2 + b_4 xy + b_5 y^2 + b_6 x^3 + b_7 x^2 y + b_8 xy^2 + b_9 y^3 + \ldots + b_{14} y^4$$

Coefficients $a_0$ to $a_{14}$ and $b_0$ to $b_{14}$ of these polynomials are the aforementioned main deflection correction coefficients, and data that defines the main deflection correction coefficients $a_0$ to $a_{14}$ and $b_0$ to $b_{14}$ for each of the apertures 22 of the aperture member 203 is stored in the storage device 142. For example, the storage device 142 stores the main deflection correction coefficients $a_0$ to $a_{14}$ and $b_0$ to $b_{14}$ for each of the five apertures 22 at the center and four corners of the aperture member 203.

The main deflection correction coefficients are calculated and stored in the storage device 142 in advance. FIG. 9 is a flowchart for describing a main-deflection-correction-coefficient calculation method. First, a beam that is set to ON is determined (step S101). For example, it is determined that a beam that passes through the aperture 22 at the center of the aperture member 203 is set to ON.

The XY stage 105 is moved, and the cross of the mark M is scanned (steps S102 and S103). The detector 212 detects reflected electrons, and the beam position detection unit 113 calculates the position of the beam from a profile obtained by arranging the detected reflected electrons in time series and the position of the stage at that time. Movement of the stage and scanning of the mark M are repeated until a sufficient number of measurement points for calculation of the main deflection correction coefficients are obtained (steps S102 to S104). For example, the beam positions are calculated by performing scanning after the mark M is sequentially moved to the positions P1 to P5 illustrated in FIG. 4.

The main deflection correction coefficients $a_0$ to $a_{14}$ and $b_0$ to $b_{14}$ are determined from the calculated beam positions obtained by moving the mark M to a plurality of positions in the main deflection field (step S105). The similar measurement is repeatedly performed by switching between the beams set to ON (steps S101 to S106). For example, beams that pass through the apertures 22 at the four corners of the aperture member 203 are sequentially selected one by one as the ON beam. In this way, the main deflection correction coefficients $a_0$ to $a_{14}$ and $b_0$ to $b_{14}$ can be determined for each of the apertures 22 of the aperture member 203. The main deflection correction coefficients $a_0$ to $a_{14}$ and $b_0$ to $b_{14}$ for each of the apertures 22 are stored in the storage device 142 (step S107). For example, five sets of the main deflection correction coefficients $a_0$ to $a_{14}$ and $b_0$ to $b_{14}$ for the apertures 22 at the center and four corners of the aperture member 203 are stored in the storage device 142.

A method for measuring the beam shape by using the main deflection correction coefficients will be described by using a flowchart illustrated in FIG. 10. First, a beam set to ON is determined (step S201). For example, it is determined that a beam that passes through the aperture at the center of the aperture member 203 is set to ON.

Then, the XY stage 105 is moved so as to locate the mark M right under the ON beam (step S202). The coefficient acquisition unit 114 acquires, from the storage device 142, the main deflection correction coefficients corresponding to the position of the aperture 22 of the aperture member 203 for the ON beam (step S203). Then, the cross of the mark M is scanned (step S204). When the mark is scanned, the beam shape calculation unit 115 calculates an amount of main deflection distortion from the aforementioned polynomials that use the acquired main deflection correction coefficients and corrects the amount of deflection applied by the main deflector 209 so that the main deflection field has a square shape.

The detector 212 detects reflected electrons, and the beam position detection unit 113 calculates the position of the beam from a profile obtained by arranging the detected reflected electrons in time series and the position of the stage at that time.

Similar measurement is repeatedly performed after the beam set to ON is switched (steps S201 to S205). For example, beams that pass through the apertures 22 at the four corner of the aperture member 203 are sequentially selected one by one as the ON beam. In step S203, the coefficient acquisition unit 114 acquires, from the storage device 142, the main deflection correction coefficients, which change depending on the position of the aperture 22 of the aperture member 203 for the ON beam. The beam shape calculation unit 115 calculates the beam shape from the positions of the beams (step S206).

In accordance with the present embodiment, the shape of the main deflection field is corrected so that the main deflection fields of beams that pass through the different apertures 22 of the aperture member 203 have the same shape, and a distortion of the beam shape that results from deflection applied by the main deflector 209 is suppressed. Accordingly, the beam shape can be measured accurately.

The adjustment unit 116 adjusts the beam reduction ratio or the like on the basis of the measured beam shape. Accordingly, the shape and dimensions of the multiple beams with which the substrate 101 is irradiated can be adjusted accurately, and consequently the stitching accuracy of the written figures can be improved.

In the above-described embodiment, the main deflection correction coefficients $a_0$ to $a_{14}$ and $b_0$ to $b_{14}$ for each beam used in measurement of the beam shape are stored in the storage device 142. For example, in the case where five beams that pass through the apertures 22 at the center and four corners of the aperture member 203 are used, five sets of main deflection correction coefficients $a_0$ to $a_{14}$ and $b_0$ to $b_{14}$ for the respective apertures 22 are stored in the storage device 142.

A beam that passes through the aperture 22 different from the apertures 22 for which the main deflection correction coefficients $a_0$ to $a_{14}$ and $b_0$ to $b_{14}$ are stored may be used in measurement of the beam shape. In this case, the coefficient acquisition unit 114 extracts, from the storage device 142, a plurality of sets of main deflection correction coefficients for the plurality of apertures 22 located around (in the vicinity of) the aperture 22 through which the beam used in measurement of the beam shape passes and calculates main deflection correction coefficients by performing linear interpolation (bilinear interpolation).

In addition, the main deflection correction coefficients $a_0$ to $a_{14}$ and $b_0$ to $b_{14}$ may be expressed as a function that uses the position of the aperture 22 of the aperture member 203 as a variable, and this function may be stored in the storage device 142. The coefficient acquisition unit 114 extracts the function from the storage device 142 and substitutes the position of the aperture 22 through which the ON beam passes to calculate the main deflection correction coefficients $a_0$ to $a_{14}$ and $b_0$ to $b_{14}$.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged-particle beam writing apparatus comprising:
    a stage on which a substrate is placed and that is continuously movable;
    an emitter emitting a charged-particle beam;
    an aperture member that has a plurality of openings and that is irradiated with the charged-particle beam in a region including the plurality of openings and forms multiple beams by letting part of the charged-particle beam pass through the plurality of openings;
    a blanking plate on which a plurality of blankers are disposed, each of the plurality of blankers being configured to perform blanking deflection for switching between ON and OFF of a corresponding beam among the multiple beams having passed through the plurality of openings of the aperture member;
    a main deflector deflecting beams having been subjected to blanking deflection to a writing position of the beams in accordance with movement of the stage;
    a detector scanning a mark on the stage with each of the beams having been deflected by the main deflector and detecting a beam position from a change in intensity of reflected charged particles and a position of the stage; and
    a beam shape calculator switching an ON beam by using the blankers, scanning the mark with the ON beam, and calculating a shape of the multiple beams on the stage from a beam position of each ON beam,
    wherein a shape of a deflection field of the main deflector of each of beams that pass through different openings of the aperture member is corrected to have a same predetermined shape by using a polynomial representing an amount of beam position shift that is dependent on a beam deflection position of the main deflector and then the mark is scanned with the ON beam, and
    wherein the polynomial is different for each ON beam.

2. The apparatus according to claim 1, further comprising:
    a storage device storing a plurality of sets of coefficients of the polynomial, each of the plurality of sets corresponding to one of the plurality of openings of the aperture member; and
    a coefficient acquisition processing circuitry acquiring, from the storage device, coefficients corresponding to the opening that forms the ON beam.

3. The apparatus according to claim 2, wherein the coefficient acquisition processing circuitry acquires, from the storage device, a plurality of sets of coefficients corresponding to a plurality of openings located around an opening that forms the ON beam and generates the polynomial for use in correction by performing linear interpolation on the plurality of sets of coefficients.

4. The apparatus according to claim 2,
    wherein the plurality of openings are formed in a matrix in the aperture member, and
    wherein the storage device stores coefficients of the polynomial corresponding to an opening located at the center and coefficients of the polynomial corresponding to openings located at four corners among the plurality of openings.

5. The apparatus according to claim 1, further comprising:
    a storage device storing a function used to calculate coefficients of the polynomial from a position of an opening of the aperture member; and
    a coefficient acquisition processing circuitry determining coefficients of the polynomial by substituting the position of the opening that forms the ON beam into the function.

6. An adjustment method for a multi charged-particle beam writing apparatus, comprising:
    emitting a charged-particle beam;
    forming multiple beams by letting the charged-particle beam pass through a plurality of openings of an aperture member;
    performing, by using each of a plurality of blankers, blanking deflection for switching between ON and OFF of a corresponding beam among the multiple beams;
    deflecting, by using a main deflector, beams having been subjected to blanking deflection to a writing position of the beams in accordance with movement of a stage on which a substrate can be placed;
    scanning a mark on the stage with each of the beams deflected by the main deflector and detecting a beam position from a change in intensity of reflected charged particles and a position of the stage;
    switching an ON beam by using the blankers, scanning the mark with the ON beam, and calculating a shape of the multiple beams on the stage from a beam position of each ON beam; and
    adjusting dimensions of the multiple beams on the basis of the calculated shape of the multiple beams,
    wherein a shape of a deflection field of the main deflector of each of beams that pass through different openings of the aperture member is corrected to have a same predetermined shape by using a polynomial representing an amount of beam position shift that is dependent on a beam deflection position of the main deflector and then the mark is scanned with the ON beam, and
    wherein the polynomial is different for each ON beam.

7. The method according to claim 6, wherein coefficients corresponding to the opening that forms the ON beam are acquired from a storage device that stores a plurality of sets of coefficients of the polynomial, each of the plurality of sets corresponding to one of the plurality of openings of the aperture member.

8. The method according to claim 7, wherein a plurality of sets of coefficients corresponding to a plurality of openings located around an opening that forms the ON beam are acquired from the storage device and the polynomial for use in correction is generated by performing linear interposition on the plurality of sets of coefficients.

9. The method according to claim 7, wherein the plurality of openings are formed in a matrix in the aperture member, and
    wherein the storage device stores coefficients of the polynomial corresponding to an opening located at the center and coefficients of the polynomial corresponding to openings located at four corners among the plurality of openings.

10. The method according to claim 6, wherein coefficients of the polynomial are determined by substituting a position of the opening that forms the ON beam into a function used to calculate coefficients of the polynomial from a position of an opening of the aperture member.

* * * * *